(12) United States Patent
Zhou et al.

(10) Patent No.: US 10,509,198 B1
(45) Date of Patent: Dec. 17, 2019

(54) LEVER SYSTEM FOR DRIVING MIRRORS OF A LIDAR TRANSMITTER

(71) Applicant: DiDi Research America, LLC, Mountain View, CA (US)

(72) Inventors: Qin Zhou, Mountain View, CA (US); Youmin Wang, Mountain View, CA (US)

(73) Assignee: DiDi Research America, LLC, Mountain View, CA (US)

( * ) Notice: Subject to any disclaimer, the term of this patent is extended or adjusted under 35 U.S.C. 154(b) by 0 days.

(21) Appl. No.: 16/213,999

(22) Filed: Dec. 7, 2018

(51) Int. Cl.
| | | |
|---|---|---|
| *G02B 7/18* | (2006.01) |
| *G02B 7/182* | (2006.01) |
| *G02B 26/08* | (2006.01) |
| *G01S 7/481* | (2006.01) |
| *G02B 26/10* | (2006.01) |
| *G01S 17/10* | (2006.01) |
| *G01S 17/93* | (2006.01) |
| *G01S 17/89* | (2006.01) |

(52) U.S. Cl.
CPC .......... *G02B 7/1821* (2013.01); *G01S 7/4817* (2013.01); *G02B 26/085* (2013.01); *G02B 26/10* (2013.01); *G01S 17/10* (2013.01); *G01S 17/89* (2013.01); *G01S 17/936* (2013.01)

(58) Field of Classification Search
None
See application file for complete search history.

(56) References Cited

U.S. PATENT DOCUMENTS

| | | | |
|---|---|---|---|
| 6,629,461 B2 | 10/2003 | Behin et al. | |
| 7,357,874 B2 | 4/2008 | Moffat et al. | |
| 9,036,231 B2 | 5/2015 | Zhou | |
| 10,048,374 B2 | 8/2018 | Hall et al. | |
| 2005/0099670 A1 | 5/2005 | Kimura et al. | |
| 2008/0239446 A1* | 10/2008 | Jung | G02B 26/0841 359/225.1 |
| 2011/0062110 A1 | 3/2011 | Kumar et al. | |
| 2011/0080627 A1* | 4/2011 | He | B81B 3/0062 359/224.1 |
| 2011/0303638 A1 | 12/2011 | Zhang et al. | |
| 2014/0300942 A1 | 10/2014 | Van Lierop et al. | |
| 2015/0217990 A1* | 8/2015 | Carminati | B81B 3/0062 353/98 |
| 2017/0005257 A1* | 1/2017 | Uchino | B81B 3/0045 |
| 2017/0108693 A1* | 4/2017 | Straub | G02B 26/085 |
| 2017/0357075 A1* | 12/2017 | Uchino | B81B 3/0045 |
| 2019/0018233 A1* | 1/2019 | Fu | G02B 26/101 |

FOREIGN PATENT DOCUMENTS

| | | |
|---|---|---|
| CN | 108061966 A | 5/2018 |
| CN | 109154661 | 1/2019 |
| DE | 102007058237 A1 | 6/2009 |

OTHER PUBLICATIONS

PCT/US2018/065042, "International Search Report and Written Opinion", dated Mar. 22, 2019, 9 pages.

* cited by examiner

*Primary Examiner* — Jennifer D. Carruth
(74) *Attorney, Agent, or Firm* — Kilpatrick Townsend & Stockton LLP

(57) ABSTRACT

A lever is used to rotate a microelectromechanical systems (MEMS) mirror. The lever can be used to provide more torque from a vertical comb drive. The MEMS mirror can be part of an array of micro mirrors used for beam steering a laser in a Light Detection and Ranging (LiDAR) system for an autonomous vehicle.

10 Claims, 8 Drawing Sheets
(4 of 8 Drawing Sheet(s) Filed in Color)

LEVER SYSTEM FOR DRIVING MIRRORS OF A LIDAR TRANSMITTER

CROSS-REFERENCES TO RELATED APPLICATIONS

The following eight U.S. patent applications (which includes the present application) are being filed concurrently, and the entire disclosures of the other applications are incorporated by reference into this application for all purposes:

Application Ser. No. 16/213,990, filed Dec. 7, 2018, entitled "MULTI-THRESHOLD LIDAR DETECTION";

Application Ser. No. 16/213,992, filed Dec. 7, 2018, entitled "MIRROR ASSEMBLY FOR LIGHT STEERING";

Application Ser. No. 16/214,010, filed Dec. 7, 2018, entitled "COUPLED AND SYNCHRONOUS MIRROR ELEMENTS IN A LIDAR-BASED MICRO-MIRROR ARRAY;

Application Ser. No. 16/214,013, filed Dec. 7, 2018, entitled "COUPLED AND SYNCHRONOUS MIRROR ELEMENTS IN A LIDAR-BASED MICRO-MIRROR ARRAY;

Application Ser. No. 16/213,995, filed Dec. 7, 2018, entitled "NON-LINEAR SPRINGS TO UNIFY THE DYNAMIC MOTION OF INDIVIDUAL ELEMENTS IN A MICRO-MIRROR ARRAY";

Application Ser. No. 16/213,997, filed Dec. 7, 2018, entitled "NON-LINEAR SPRINGS TO UNIFY THE DYNAMIC MOTION OF INDIVIDUAL ELEMENTS IN A MICRO-MIRROR ARRAY";

Application Ser. No. 16/213,999, filed Dec. 7, 2018, entitled "A LEVER SYSTEM FOR DRIVING MIRRORS OF A LIDAR TRANSMITTER"; and Application Ser. No. 16/214,001, filed Dec. 7, 2018, entitled "SYSTEM AND METHODS FOR CONTROLLING MICRO-MIRROR ARRAY".

BACKGROUND

Light steering typically involves the projection of light in a pre-determined direction to facilitate, for example, the detection and ranging of an object, the illumination and scanning of an object, or the like. Light steering can be used in many different fields of applications including, for example, autonomous vehicles, medical diagnostic devices, etc.

Modern vehicles are often fitted with a suite of environment detection sensors that are designed to detect objects and landscape features around the vehicle in real-time that can be used as a foundation for many present and emerging technologies such as lane change assistance, collision avoidance, and autonomous driving capabilities. Some commonly used sensing systems include optical sensors (e.g., infra-red, cameras, etc.), radio detection and ranging (RADAR) for detecting presence, direction, distance, and speeds of other vehicles or objects, magnetometers (e.g., passive sensing of large ferrous objects, such as trucks, cars, or rail cars), and light detection and ranging (LiDAR).

LiDAR typically uses a pulsed light source and detection system to estimate distances to environmental features (e.g., vehicles, structures, etc.). In some systems, a laser or burst of light (pulse) is emitted and focused through a lens assembly and a reflection of the pulse off of an object is collected by a receiver. A time-of-flight (TOF) of the pulse can be measured from the time of emission to the time the reflection is received, which may manifest as a single data point. This process can be repeated very rapidly over any desired range (typically 360 degrees over a 2D plane for ground-based vehicles, and a 3D region for aircraft) to form a collection of points that are dynamically and continuously updated in real-time, forming a "point cloud." The point cloud data can be used to estimate, for example, a distance, dimension, and location of the object relative to the LiDAR system, often with very high fidelity (e.g., within 5 cm).

Despite the promise that LiDAR and other sensing systems bring to the continued development of fully autonomous transportation, there are challenges that limit its widespread adoption. LiDAR systems are often expensive, large, and bulky. In some cases, multiple emitters may be needed to accurate track a scene, particularly for systems that require accuracy over a large range and field-of-view (FOV). While significant strides have been made to push autonomous vehicle technology to greater commercial adoption, more improvements are needed.

BRIEF SUMMARY

In certain embodiments, a device for beam steering in a Light Detection and Ranging (LiDAR) system of an autonomous vehicle is disclosed. The device can comprise a mirror, a combdrive actuator, a lever, and/or a hinge. The mirror comprises a reflective surface and a supporting beam. The supporting beam is configured to rotate the reflective surface by force being applied to the supporting beam. The combdrive actuator is configured to apply a torque to the supporting beam, wherein the supporting beam is mechanically between the combdrive actuator and the reflective surface. The lever mechanically couples the combdrive actuator with the supporting beam, wherein the lever is configured to apply a force to the supporting beam. The hinge couples the lever with the supporting beam, wherein the hinge is configured to allow for articulated movement between the lever and the supporting beam.

In some embodiments, the combdrive actuator applies a force to the mirror such that the mirror rotates in an opposite direction as a rotation of the combdrive actuator; the supporting beam is a post on one side of the mirror; the combdrive actuator is a first combdrive actuator; the torque is a first torque; the device further comprises a second combdrive actuator on a same side of the mirror as the first combdrive actuator, the second combdrive actuator is mechanically coupled with the supporting beam, and/or the second combdrive actuator is configured to apply a second torque to the supporting beam; the hinge is a first hinge; the lever is a first lever; the device further comprises: a second lever coupled with the second combdrive actuator, and/or a second hinge that mechanically couples the second lever with the supporting beam; the second hinge is configured to provide for articulated movement between the second lever and the supporting beam; the device further comprises an actuator with a spring configured to harmonically oscillate the mirror about a first axis; the supporting beam is configured to rotate the reflective surface about a second axis and the first axis is not parallel to the second axis; a rotor of the combdrive actuator rotates about a first axis, the supporting beam is configured to rotate the reflective surface about a second axis, the first axis is parallel with the second axis, and the hinge is closer to the second axis than the first axis; the supporting beam is a first supporting beam; the device further comprises: a second supporting beam on an opposite side of the mirror than the first supporting beam, a second combdrive actuator on a same side of the mirror as the first combdrive actuator, wherein the second combdrive actuator is coupled with the first supporting beam, a third combdrive actuator on the opposite side of the mirror, wherein the third combdrive actuator is coupled with the second supporting beam, and/or a fourth combdrive actuator on the opposite side of the mirror, wherein the fourth combdrive actuator is coupled with the second supporting beam; the device further comprises a first actuator and a second actuator configured to rotate the mirror about a first axis, the first combdrive actuator, the second combdrive actuator, the third combdrive actuator, and the fourth combdrive actuator are configured to rotate the mirror about a second axis, and the first axis is not parallel to the second axis; the lever and the hinge are made from a silicon crystal layer of a semiconductor wafer; and/or the reflective surface is rectangular.

In certain embodiments, a method of providing torque for beam steering in a Light Detection and Ranging (LiDAR) system is disclosed. The method comprises applying power to a combdrive actuator; rotating a lever using the combdrive actuator, wherein the lever is coupled to a rotor of the combdrive actuator; applying a torque to a supporting beam of a mirror using the lever, wherein the mirror comprises a reflective surface; articulating a hinge, wherein the hinge is between the lever and the supporting beam and provides for articulated movement between the lever and the supporting beam; and/or rotating the reflective surface of the mirror based on rotation of the lever.

In some embodiments, the combdrive actuator is a comb drive having a plurality of stator fingers and a plurality of rotor fingers; the mirror is part of a mirror array, and the method further comprises rotating the mirror in synchronization with other mirrors of the mirror array to steer an optical beam reflected by the mirror array; the combdrive actuator is a first combdrive actuator; the lever is a first lever; the torque is a first torque; the hinge is a first hinge; the method further comprises: applying power to a second combdrive actuator, rotating a second lever using the second combdrive actuator, wherein the second lever is coupled to a rotor of the second combdrive actuator, applying a second torque to the supporting beam using the second lever, articulating a second hinge, wherein the second hinge is between the second lever and the supporting beam and provides for articulated movement between the second lever and the supporting beam, and/or rotating the reflective surface of the mirror based on rotation of the second lever.

In certain embodiments, a device for beam steering in a Light Detection and Ranging (LiDAR) system of an autonomous vehicle comprises a mirror, a first combdrive actuator, a lever, and/or a second combdrive actuator. The mirror comprises a reflective surface and/or a supporting beam, wherein the supporting beam is configured to rotate the reflective surface by force being applied to the supporting beam. The first combdrive actuator is coupled with the supporting beam and is configured to apply a torque to the supporting beam. The supporting beam is mechanically between the first combdrive actuator and the reflective surface. The lever is between the second combdrive actuator and the supporting beam. The second combdrive actuator is configured to use the lever to apply a force to the supporting beam. The supporting beam is mechanically between the second combdrive actuator and the mirror.

In some embodiments, the supporting beam is mechanically between the first combdrive actuator and the second combdrive actuator; the first combdrive actuator is mechanically between the supporting beam and the second combdrive actuator; a hinge is mechanically between the first combdrive actuator and the second combdrive actuator; the second combdrive actuator is driven 180 degrees out of phase with the first combdrive actuator; and/or the first combdrive actuator rotates in an opposite direction as a rotation of the mirror.

Further areas of applicability of the present disclosure will become apparent from the detailed description provided hereinafter. It should be understood that the detailed description and specific examples, while indicating various embodiments, are intended for purposes of illustration only and are not intended to necessarily limit the scope of the disclosure.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The detailed description is set forth with reference to the accompanying figures.

Figure 1:
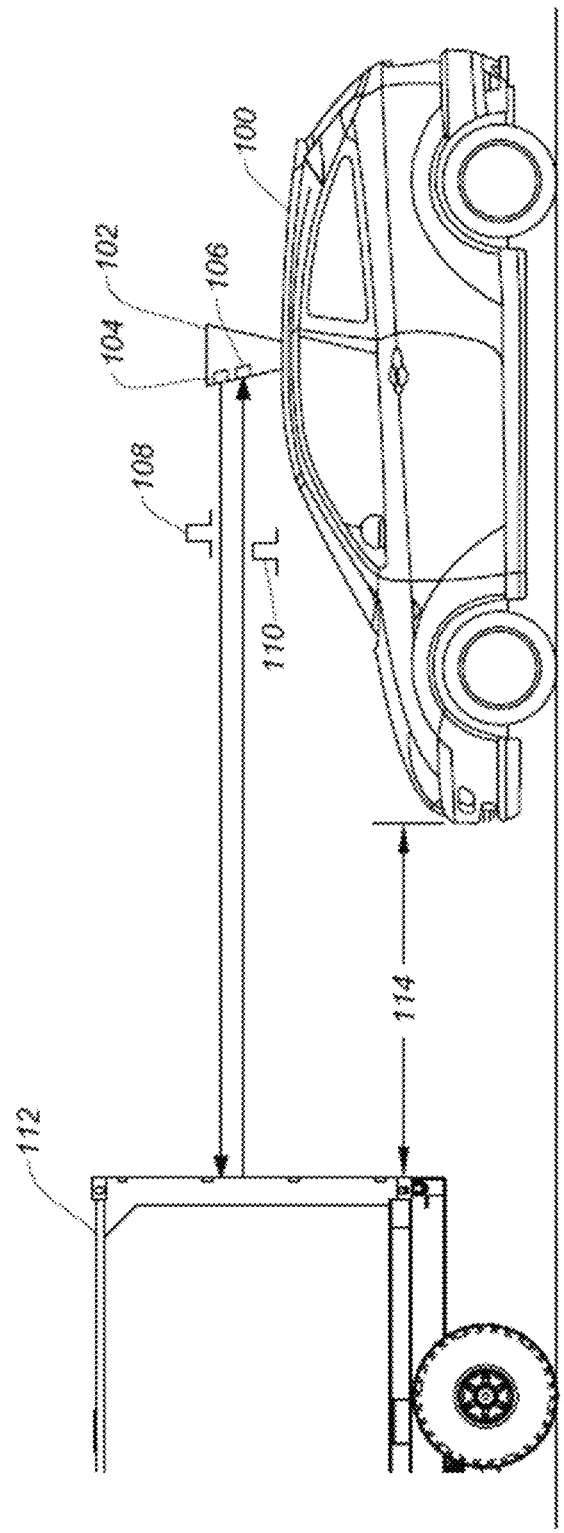
FIG. 1 shows an autonomous driving vehicle utilizing aspects of certain embodiments of disclosed techniques.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Aspects of the present disclosure relate generally to mirrors used for beam steering, and without limitation, to beam steering in a Light Detection and Ranging (LiDAR) system (e.g., for use in a system with an autonomous vehicle). Other examples of beam steering include: the head light of a manually-driven vehicle can include the light steering transmitter, which can be controlled to focus light towards a particular direction to improve visibility for the driver; and optical diagnostic equipment, such as an endoscope, can include a light steering transmitter to steer light in different directions onto an object in a sequential scanning process to obtain an image of the object for diagnosis.

A light steering transmitter may include a movable mirror assembly to facilitate configurable and precise control of a light projection. A mirror can be moved (e.g., rotated) by actuators to reflect (and steer) light from a light source towards a pre-determined angle. Light steering can be implemented by way of a mirror assembly included in the light steering transmitter. A mirror in the mirror assembly can be moved by actuators to steer light from a light source towards a pre-configured direction. For improved integration, the mirror assembly, actuators, and the control circuitries that configure the actuators to set the angles of projection can be integrated on a semiconductor substrate, with the mirror assembly and actuators can be formed as microelectromechanical systems (MEMS) on the semiconductor substrate.

In some examples, a mirror assembly may include a single mirror. The single mirror can be coupled with two pairs of actuators and rotatable on two non-parallel axes (e.g., orthogonal axes). A first pair, or set, of actuators can rotate the mirror around a first axis to steer the light along a first dimension, whereas a second pair, or set, of actuators can rotate the mirror around a second axis to steer the light along a second dimension. Different combinations of angle of rotations around the first axis and the second axis can provide a two-dimensional FOV.

Actuators moving the mirror about the first axis comprise a spring. The spring is used so the mirror can be driven to oscillate at a harmonic frequency, wherein the harmonic frequency is based on a combination of a spring constant of the spring and a mass of the mirror. The actuators moving the mirror about the second axis do not comprise a spring. Instead actuators moving the mirror about the second axis use a DC bias to control steering along the second dimension. Driving the mirror about the first axis at a harmonic frequency requires less force by actuators than driving the mirror about the second axis by actuators using a DC bias. One way to increase the force exerted by actuators driven by DC bias is to make the actuators much longer (e.g., 3, 4, or 5 times longer) than actuators driven at a harmonic frequency. However, using longer actuators takes up chip space and does not allow for as much mirror space on the chip for a mirror array. Long device actuators can also reduce device reliability.

Another way to increase force exerted by actuators, is to have actuators with longer rotor and stator fingers and/or have two or more actuators on one side of a mirror to rotate the mirror about the second axis. For example, a lever can be used to link an actuator with the mirror. By using a lever, a greater force can be applied to a supporting beam of a mirror for more effective rotation of the mirror. In some embodiments, an array of microelectromechanical system (MEMS) mirrors is used in LiDAR scanning system to increase scanning speed and to increase reflective surface area (e.g., one laser beam is reflected by a plurality of MEMS mirrors synchronized to act as one large reflective area). By using levers, actuators can be arranged on a chip to make more room for reflective surfaces to steer light.

In the following description, various examples of a mirror assembly and a light steering transmitter system will be described. For purposes of explanation, specific configurations and details are set forth in order to provide a thorough understanding of the embodiments. However, it will be apparent to one skilled in the art that certain embodiments may be practiced or implemented without every detail disclosed. Furthermore, well-known features may be omitted or simplified in order to prevent any obfuscation of the novel features described herein.

FIG. 1 illustrates an embodiment of an autonomous vehicle 100 in which the disclosed techniques can be implemented. The autonomous vehicle 100 includes a LiDAR module 102. LiDAR module 102 allows the autonomous vehicle 100 to perform object detection and ranging in a surrounding environment. Based on results of object detection and ranging, the autonomous vehicle 100 can maneuver to avoid a collision with objects. The LiDAR module 102 can include a transmitter 104 and a receiver 106 for light steering. The transmitter 104 can project one or more light pulses 108 at various directions at different times in a scanning pattern, while receiver 106 can monitor for a light pulse 110 which is generated by the reflection of light pulse 108 by an object. LiDAR module 102 can detect the object based on the reception of light pulse 110, and can perform a ranging determination (e.g., a distance of the object) based on a time difference between light pulses 108 and 110 and/or based on phase difference between light pulses 108 and 110. For example, as shown in FIG. 1, the LiDAR module 102 can transmit light pulse 108 at a direction directly in front of autonomous vehicle 100 at time T1 and receive light pulse 110 reflected by an object 112 (e.g., another vehicle) at time T2. Based on the reception of light pulse 110, LiDAR module 102 can determine that object 112 is directly in front of autonomous vehicle 100. Moreover, based on the time difference between T1 and T2, LiDAR module 102 can also determine a distance 114 between autonomous vehicle 100 and object 112. The autonomous vehicle 100 can adjust its speed (e.g., slowing or stopping) to avoid collision with object 112 based on the detection and ranging of object 112 by LiDAR module 102.

Figure 2:
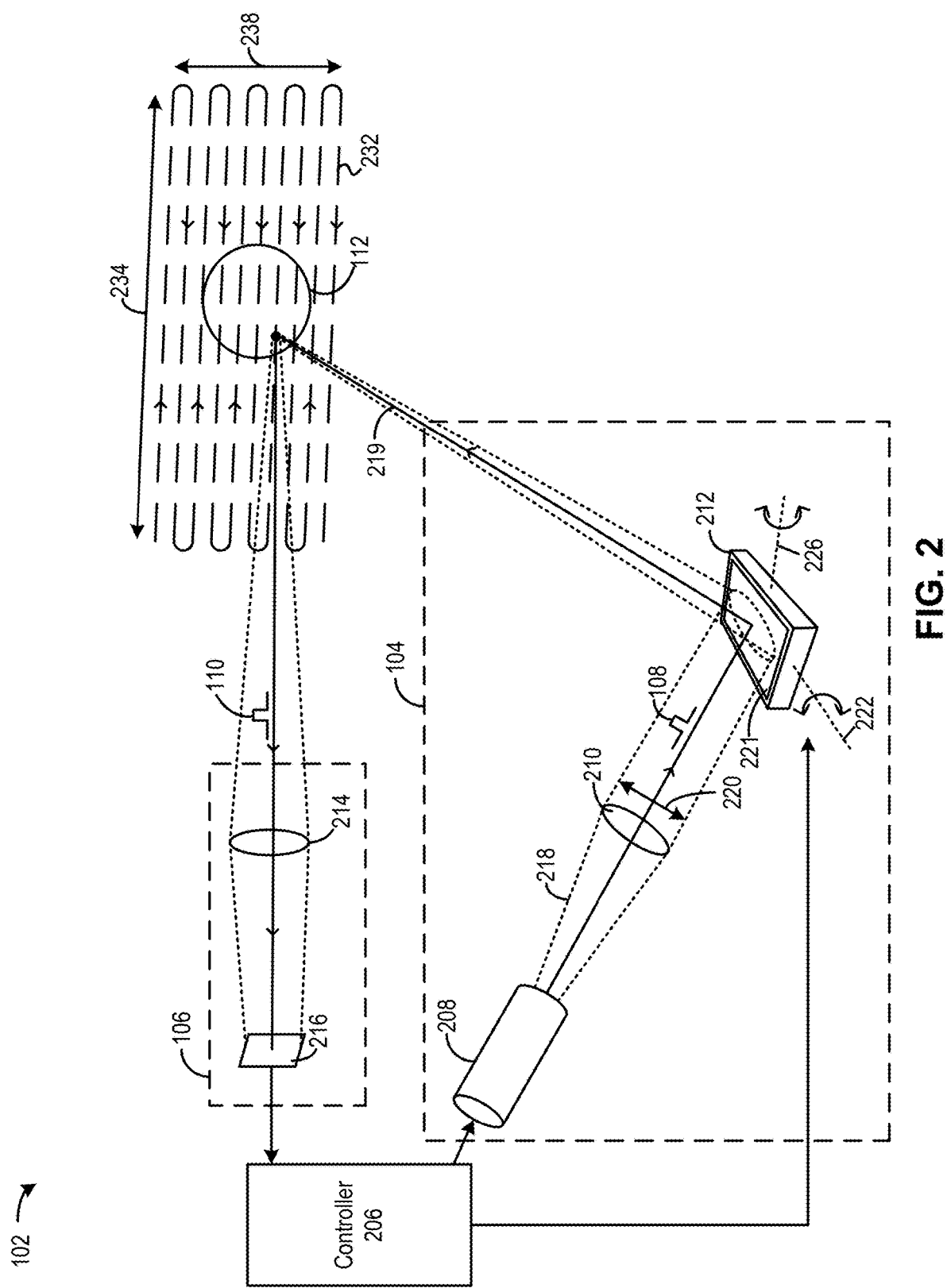
FIG. 2 illustrates an example of a light steering transmitter, according to certain embodiments.

FIG. 2 illustrates an example of internal components of a LiDAR module 102. LiDAR module 102 includes the transmitter 104, the receiver 106, and a controller 206, which controls the operations of the transmitter 104 and the receiver 106. Transmitter 104 includes a light source 208, a lens 210, and a mirror assembly 212. The light source 208 is configured to generate light pulses 108. In some embodiments, the light source 208 is a laser diode. The lens 210 is a collimator lens configured to collimate light emitted from the light source 208. The receiver 106 comprises a lens 214 and a detector 216 (e.g., a photodetector). The lens 214 is configured to focus light from light pulses 110 onto the detector 216.

The controller 206 can control the light source 208 to transmit light pulse 108, which is part of an optical beam 218. The optical beam 218 can diverge upon leaving the light source 208. The optical beam 218 is collimated by passing through lens 210. Lens 210 has an aperture width (e.g., diameter of lens 210), which can set a beam width 220 of collimated light incident on the mirror assembly 212.

The optical beam 218 is reflected by the mirror assembly 212 and steered by the mirror assembly 212 along a projection path 219 towards the object 112. The mirror assembly 212 includes one or more mirrors 221, which is rotatable. FIG. 2 illustrates the mirror assembly 212 having one mirror 221, but as to be described below, in some embodiments the mirror assembly 212 includes a plurality of mirrors. To reduce loss of light, the mirror 221 can have a length (and/or width) that matches the beam width 220. Such an arrangement can enable the mirror assembly 212 to reflect and project a larger portion of light and to mitigate dispersion.

The mirror assembly 212 further includes one or more actuators to rotate the mirror 221. The actuators can rotate mirror 221 about a first axis 222, and about a second axis 226. Rotation about the first axis 222 can change a first angle of the projection path 219 and rotation about the second axis 226 can change a second angle of the projection path 219. The controller 206 can control the actuators to produce different combinations of angles of rotation around the first axis 222 and the second axis 226 such that the movement of the projection path 219 can follow a scanning pattern 232. The scanning pattern has a first range 234 (e.g., horizontal) and a second range 238 (e.g., vertical). The first range 234 and the second range 238 define a field of view (FOV) of the transmitter 104. Light from the optical beam 218 reflects from an object within the FOV, such as object 112, to form light pulse 110, which is a reflected pulse. The light pulse 110 is detected by the receiver 106.

Figure 3:
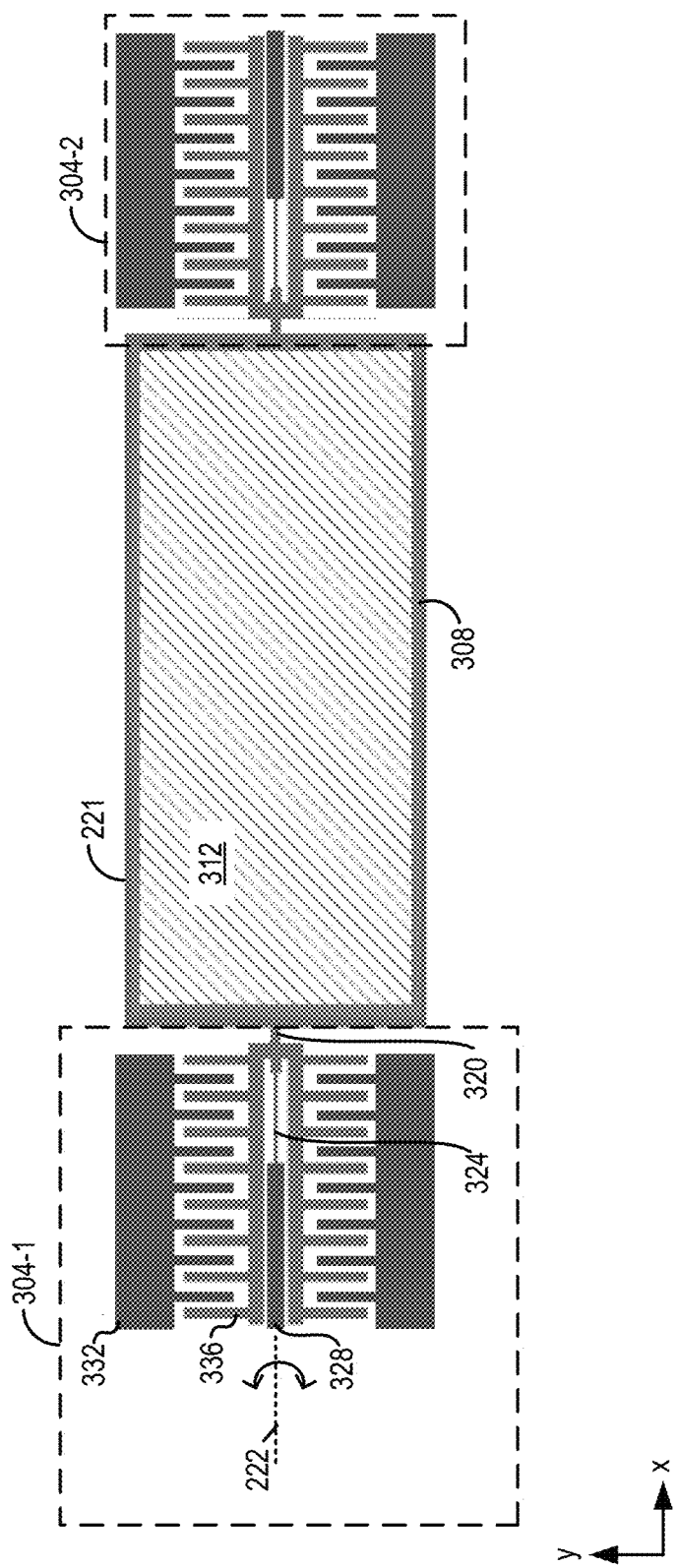
FIG. 3 depicts part of an embodiment of a mirror assembly.

FIG. 3 is a part of an embodiment of a mirror assembly 212. The mirror assembly 212 comprises a mirror 221 and an actuator 304. The mirror comprises a mirror substrate 308 and a reflective surface 312. The mirror substrate 308 is a substrate for the reflective surface 312 to be applied to, e.g., sputtering alternating dialectic layers of materials on the substrate to form a Bragg mirror on the substrate as the reflective surface 312.

The actuator 304 comprises a shaft 320, a spring 324, a post 328, and a comb drive. The comb drive comprises a stator 332 and a rotor 336. In some embodiments, the comb drive is a vertical comb drive having a plurality of stator fingers and plurality of rotor fingers. The spring 324 is mechanically coupled with the mirror 221. For example, the spring 324 is coupled to the rotor 336; the rotor 336 is coupled to the shaft 320, and the shaft 320 is coupled to the mirror substrate 308 of the mirror 221. The rotor 336 rotates back and forth around the first axis 222, e.g., +/−10, 15, 20, 25, or 30 degrees. As the rotor 336 moves, the spring 324 is twisted and the mirror 221 is rotated. The actuator 304 can be configured to work in pairs to move the mirror 221 about the first axis 222. In the embodiment shown, a first actuator 304-1 and a second actuator 304-2 work together as a pair to move the mirror 221 about the first axis 222.

The spring 324 is coupled to the rotor 336 and the post 328. The post 328 does not rotate. An electrical signal is applied to the comb drive to cause magnetic repulsion and/or attraction between the stator 332 and the rotor 336. As the rotor 336 rotates, the spring 324 is twisted, storing mechanical energy and applying a torque to the rotor 336 and/or to the shaft 320. As the rotor 336 rotates, the mirror 221 rotates because the mirror 221 is coupled to the rotor 336 by the shaft 320. An angle of the reflective surface 312 with respect to the light source 208 changes as the mirror 221 rotates. The spring 324 and the comb drive move the mirror 221 to oscillate at a given frequency, thus steering the projection path 219 of the optical beam 218 back and forth (e.g., horizontally) within the first range 234. A different actuator and/or comb drive system moves the mirror 221 about the second axis 226.

In some embodiments, the substrate is part of a silicon-on-insulator (SOI) wafer, and the reflective surface 312 is applied on top of a device layer of the SOI wafer. The reflective surface 312 is rectangular to provide more reflective surface area of an array of mirrors and/or to more efficiently use space on a chip. The mirror substrate 308, the shaft 320, the spring 324, the post 328, the stator 332, and/or the rotor 336 can be made using photolithography, e.g., the mirror substrate 308, the shaft 320, the spring 324, the post 328, the stator 332, and/or the rotor 336 are etched concurrently from a device layer of an SOI wafer. In some embodiments, electrical elements for the comb drive are formed in the device layer of the SOI wafer.

Figure 4:
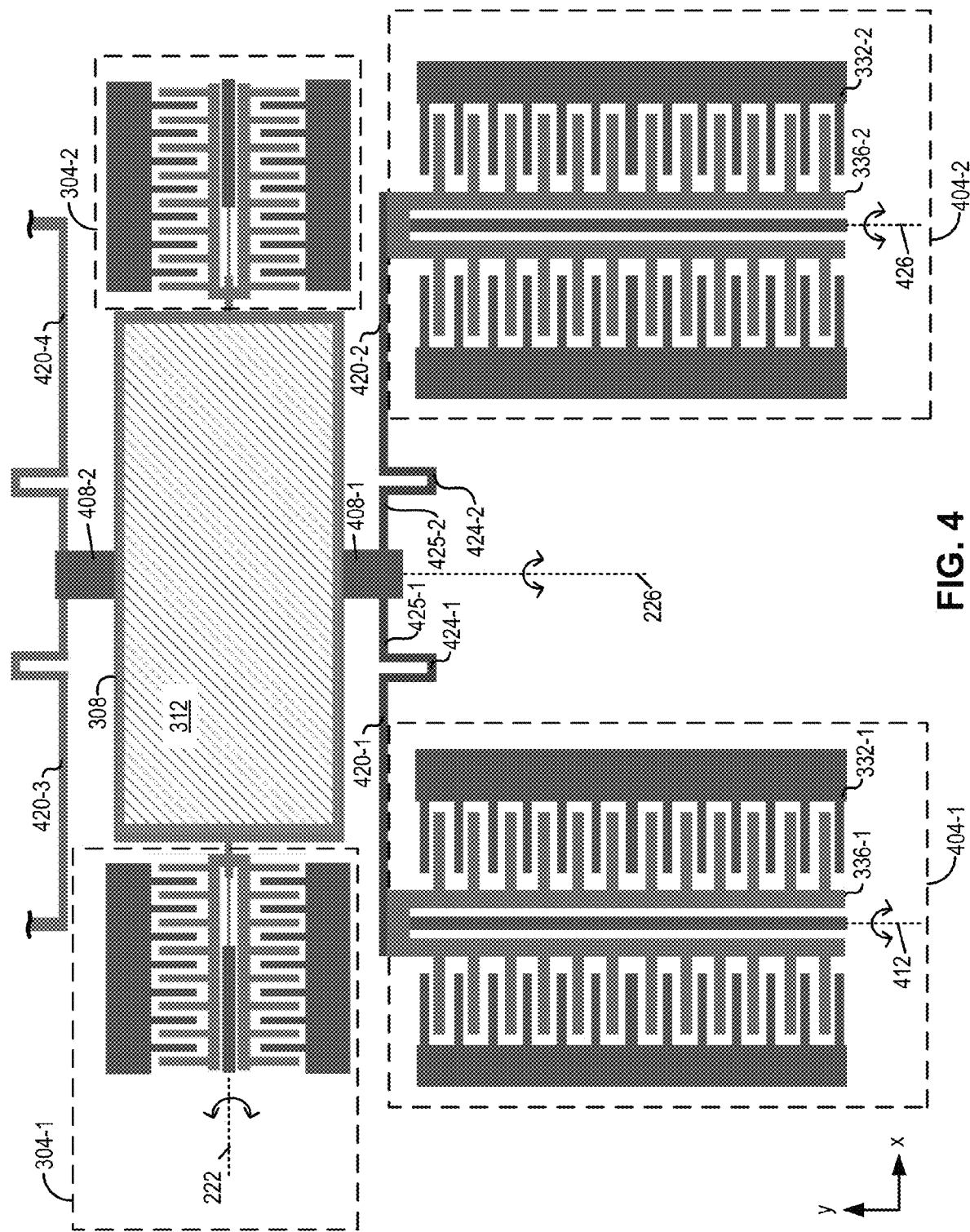
FIG. 4 depicts an embodiment of a lever used for rotating a reflective surface.

FIG. 4 depicts an embodiment of a lever used for rotating a reflective surface. The lever can be part of a mirror assembly 212. FIG. 4 shows a first actuator 304-1, a second actuator 304-2, a first combdrive actuator 404-1, and a second combdrive actuator 404-2. The actuators 304 and combdrive actuators 404 are used to rotate the reflective surface 312 of the mirror 221 about the first axis 222 and the second axis 226.

The first actuator 304-1 and a second actuator 304-2 are used to rotate the reflective surface 312 about the first axis 222. Rotors 336 of the first actuator 304-1 and the second actuator 304-2 rotate about the first axis 222 is a similar direction as the reflective surface 312.

The first combdrive actuator 404-1 and the second combdrive actuator 404-2 (in combination with a third combdrive actuator and a fourth combdrive actuator, not shown) are used to rotate the reflective surface 312 about the second axis 226. A first supporting beam 408-1 and a second supporting beam 408-2 extend from the mirror substrate 308 of the mirror 221. The first supporting beam 408-1 is mechanically between the first combdrive actuator 404-1 and the reflective surface 312 and mechanically between the second combdrive actuator 404-2 and the reflective surface 312. In some embodiments, the supporting beams 408 are part of the mirror substrate 308. Accordingly, the mirror 221 comprises the reflective surface 312 and the supporting beam 408. The first supporting beam 408-1 extends from one side of the mirror substrate 308. The second supporting beam 408-2 extends from another side of the mirror substrate 308. The supporting beam 408 can be an elongated post extending from one side of the mirror substrate 308 of the mirror 221. The supporting beam 408 is configured to rotate the reflective surface 312 by a force being applied to the supporting beam 408.

The first combdrive actuator 404-1 comprises a first stator 332-1 and a first rotor 336-1. The first rotor 336-1 rotates about a third axis 412. The third axis 412 is parallel with the second axis 226. The first combdrive actuator 404-1 is coupled with the first supporting beam 408-1 and is configured to apply a first torque to the first supporting beam 408-1 by applying a first force to the first supporting beam 408-1. A first lever 420-1 is between the first combdrive actuator 404-1 and the first supporting beam 408-1. The first lever 420-1 mechanically couples the first rotor 336-1 of the first combdrive actuator 404-1 with the first supporting beam 408-1. The first lever 420-1 is used to apply a force, the first force, to the first supporting beam 408-1. A first hinge 424-1 mechanically couples the first lever 420-1 with the first supporting beam 408-1. The first hinge 424-1 provides for articulated (e.g., flexible) movement between the first lever 420-1 and the first supporting beam 408-1. For example, the hinge 424 is configured to expand and contract as the lever 420 is moved. In some embodiments, a first stub 425-1 couples the first lever 420-1 to the first hinge 424-1. The first stub 425-1 can be rigidly attached to the first supporting beam 408-1. The first hinge 424-1 provides for articulated movement between the first lever 420-1 and the first supporting beam 408-1 by allowing for articulated movement between the first stub 425-1 and the first lever 420-1. In some embodiments, the hinge 424 can be used to limit rotation of the mirror 221 for non-linear driving of mirrors, as described in U.S. patent application Ser. No. 16/213,995. In some embodiments, the hinge 424 can act as a spring, though normally the hinge 424 does not because the hinge 424 is too soft in a horizontal constraint (e.g., in the x direction in FIG. 4) to be considered a spring.

The second combdrive actuator 404-2 comprises a second stator 332-2 and a second rotor 336-2. The second rotor 336-2 rotates about a fourth axis 426. The fourth axis 426 is parallel with the second axis 226. The second combdrive actuator 404-2 is coupled with the first supporting beam 408-1 and is configured to apply a second torque to the first supporting beam 408-1 by applying a second force to the first supporting beam 408-1. A second lever 420-2 is between the second combdrive actuator 404-2 and the first supporting beam 408-1. The second lever 420-2 mechanically couples the second rotor 336-2 of the second combdrive actuator 404-2 with the first supporting beam 408-1. The second lever 420-2 is used to apply a force, the second force, to the first supporting beam 408-1. A second hinge 424-2 mechanically couples the second lever 420-2 with the first supporting beam 408-1. The second hinge 424-2 provides for articulated movement between the second lever 420-2 and the first supporting beam 408-1. In some embodiments, a second stub 425-2 couples the second lever 420-2 to the second hinge 424-2. The second stub 425-2 can be rigidly attached to the first supporting beam 408-1. The second hinge 424-2 provides for articulated movement between the second lever 420-2 and the first supporting beam 408-1 by allowing for articulated movement between the second stub 425-2 and the second lever 420-2. The first supporting beam 408-1 is mechanically between the first combdrive actuator 404-1 and the second combdrive actuator 404-2.

A third hinge 424-3 couples a third combdrive actuator with the second supporting beam 408-2, and a fourth hinge 424-4 couples a fourth combdrive actuator with the second supporting beam 408-2, similar to the first combdrive actuator 404-1 and the second combdrive actuator 404-2 being coupled with the first supporting beam 408-1. For example, the third combdrive actuator applies a third torque to the second supporting beam 408-2 and the fourth combdrive actuator applies a fourth torque to the second supporting beam 408-2, wherein the first torque, the second torque, the third torque, and the fourth torque are configured to rotate the mirror 221 in the same direction. Put another way, the first torque, the second torque, the third torque, and the fourth torque can be defined by vectors, and the vectors point in the same direction, so that the first torque, the second torque, the third torque, and the fourth torque constructively add. The third combdrive actuator and the fourth combdrive actuator are on opposite sides of the mirror 221 than the first combdrive actuator 404-1 and the second combdrive actuator 404-2. Similarly, torques created by the first actuator 304-1 and the second actuator 304-2 point in the same direction and constructively add.

In some embodiments, a spring 324 is coupled with the first rotor 336-1, and/or a spring is coupled with the second rotor 336-2, similarly as described in conjunction with the first actuator 304-1. However, in the embodiment shown in FIG. 4, there are not springs 324 coupled with the first rotor 336-1 or the second rotor 336-2. The combdrive actuators 404 provide a DC bias to rotate the mirror 221 about the second axis 226. For example, as actuators 304 are rotating the mirror 221 at a resonant frequency about the first axis 222 (to scan the first range 234 of the scanning pattern 232), the combdrive actuators 404 are stepping rotation of the mirror 221 about the second axis 226 (to scan the second range 238 of the scanning pattern 232). Since driving an actuator 304 at a harmonic frequency of the spring 324 takes less force, the actuators 304 can be smaller than the combdrive actuators 404, which provide a DC bias. The first hinge 424-1 is closer to the second axis 226 than the third axis 412 so that the first rotor 336-1 does not have to rotate as much to cause a greater rotation of the first supporting beam 408-1 and/or to apply a greater force to the first supporting beam 408-1.

Figure 5:
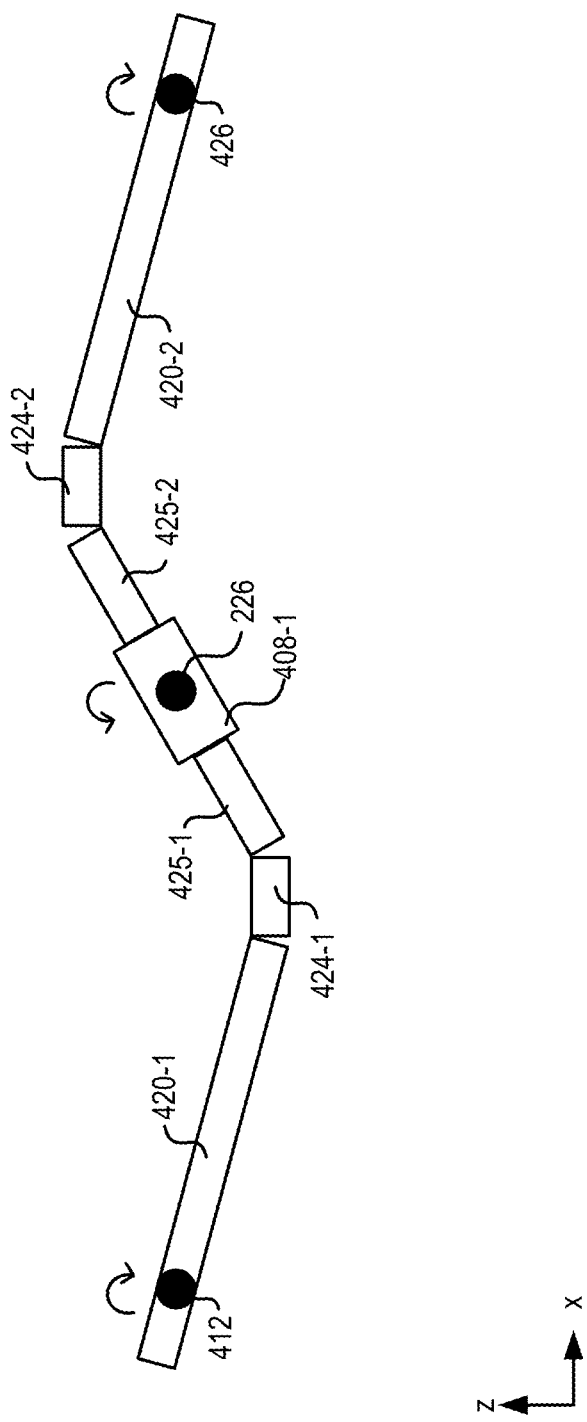
FIG. 5 depicts a simplified side view of the embodiment of the lever for rotating the reflective surface.

FIG. 5 depicts a simplified side view of the embodiment of the lever for rotating the reflective surface 312. The first lever 420-1 rotates about the third axis 412 and is coupled with the first supporting beam 408-1 via the first hinge 424-1 and the first stub 425-1. As the first lever 420-1 rotates clockwise about the third axis 412, the first lever 420-1 exerts a first force on the first supporting beam 408-1 to cause the first supporting beam 408-1 to rotate counter clockwise. As the first supporting beam 408-1 rotates counter clockwise, the reflective surface 312 is rotated counter clockwise about the second axis 226. Accordingly, the first combdrive actuator 404-1 rotates in an opposite direction of a rotation of the mirror 221. The first hinge 424-1 provides flexibility (e.g., the first hinge 424-1 expands and contracts in the x direction) between the first lever 420-1 and the first supporting beam 408-1 (e.g., between the first lever 420-1 and the first stub 425-1, which is rigidly attached to the first supporting beam 408-1).

The second lever 420-2 rotates about the fourth axis 426 and is coupled with the first supporting beam 408-1 via the second hinge 424-2 and the second stub 425-2. As the second lever 420-2 rotates clockwise about the fourth axis 426, the second lever 420-2 exerts a second force on the first supporting beam 408-1 to cause the first supporting beam 408-1 to rotate counter clockwise. As the first supporting beam 408-1 rotates counter clockwise, the reflective surface 312 is rotated counter clockwise about the second axis 226. Accordingly, the second combdrive actuator 404-2 rotates in an opposite direction of a rotation of the mirror 221. The second hinge 424-2 provides flexibility (e.g., the second hinge 424-2 expands and contracts in the x direction) between the second lever 420-2 and the first supporting beam 408-1 (e.g., between the second lever 420-2 and the second stub 425-2, which is rigidly attached to the first supporting beam 408-1).

By using levers 420, a greater force can be applied to the supporting beam 408 for more effective rotation of the supporting beam 408. Applying a greater force to rotate the supporting beam 408 can be beneficial, in some embodiments, because the mirror 221 can be harder to rotate about the second axis 226 compared to the first axis 222 since the mirror 221 is not being driven at a harmonic frequency for rotation about the second axis 226. By using a DC bias to electrically control scanning (e.g., scanning speed) in the second range 238, the complexity of tuning two different harmonic oscillators (e.g., one harmonic oscillator for rotating the mirror 221 about the first axis 222 and a second harmonic oscillator for rotating the mirror 221 about the second axis 226) with each other is removed. The angle of rotation of the combdrive actuator 404 can also be different than the angle of rotation of the supporting beam 408 because of different lengths of the lever 420. For example, the supporting beam 408 can be configured to rotate up to plus and minus 30 degrees. The combdrive actuator 404 and lever 420 can be configured to rotate plus and minus 15 degrees to rotate the supporting beam 408 plus and minus 30 degrees.

Figure 6:
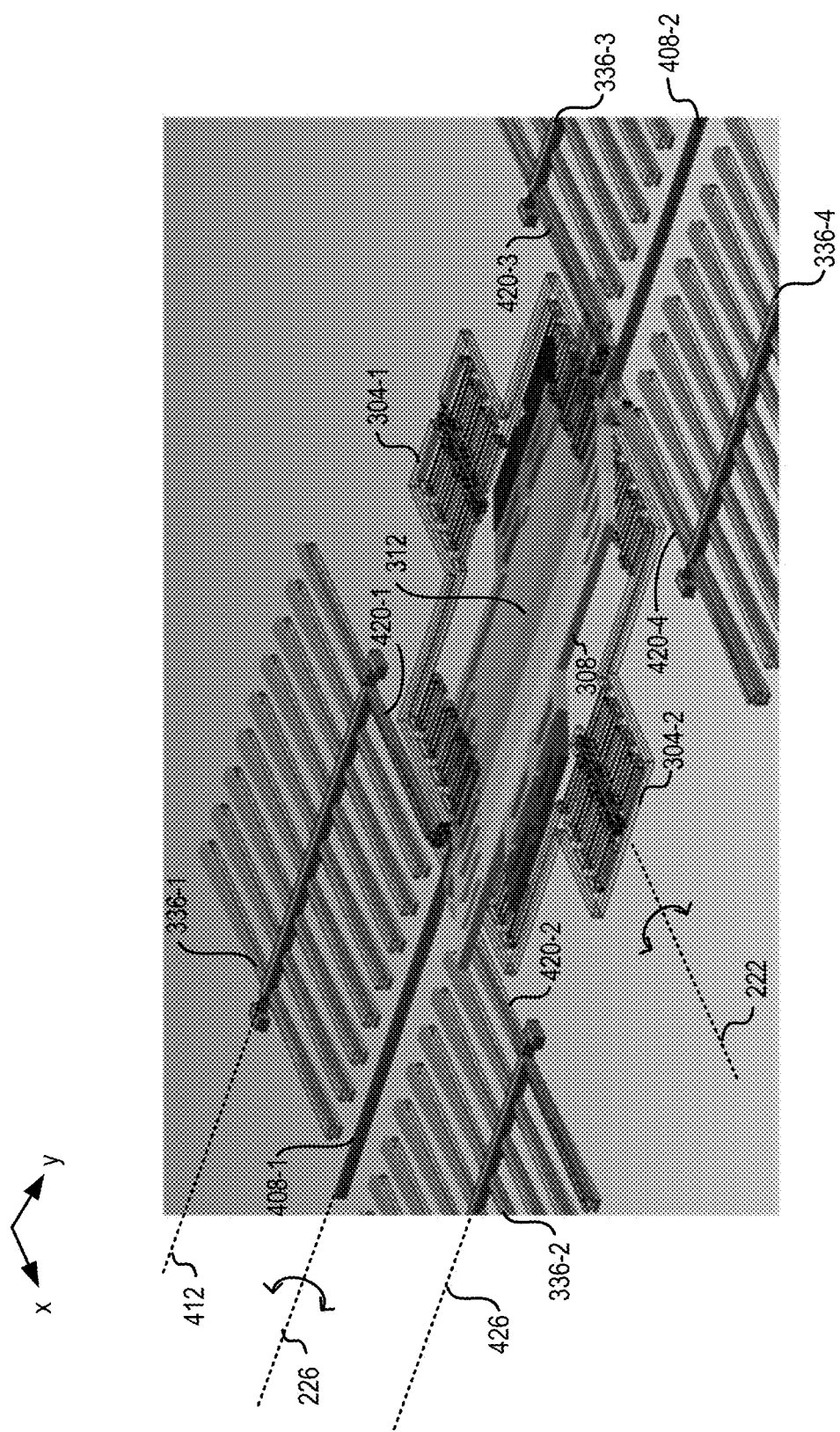
FIG. 6 depicts a simplified perspective view of an embodiment combdrive actuators for rotation a mirror.

FIG. 6 depicts a perspective view of an embodiment of comb drive actuators for rotating a mirror. FIG. 6 shows the first actuator 304-1 and the second actuator 304-2 used to rotate the reflective surface 312 about the first axis 222. The first rotor 336-1 of the first combdrive actuator 404-1, the second rotor 336-2 of the second combdrive actuator 404-2, a third rotor 336-3 of the third combdrive actuator, and a fourth rotor 336-4 of the fourth combdrive actuator are shown. The first lever 420-1 connects the first rotor 336-1 with the first supporting beam 408-1. The second lever 420-2 connects the second rotor 336-2 with the first supporting beam 408-1. The third lever 420-3 connects the third rotor 336-3 with the second supporting beam 408-2. The fourth lever 420-4 connects the fourth rotor 336-4 with the second supporting beam 408-2. The rotors 336 and levers 420 are used to rotate the reflective surface 312 about the second axis 226.

Figure 7:
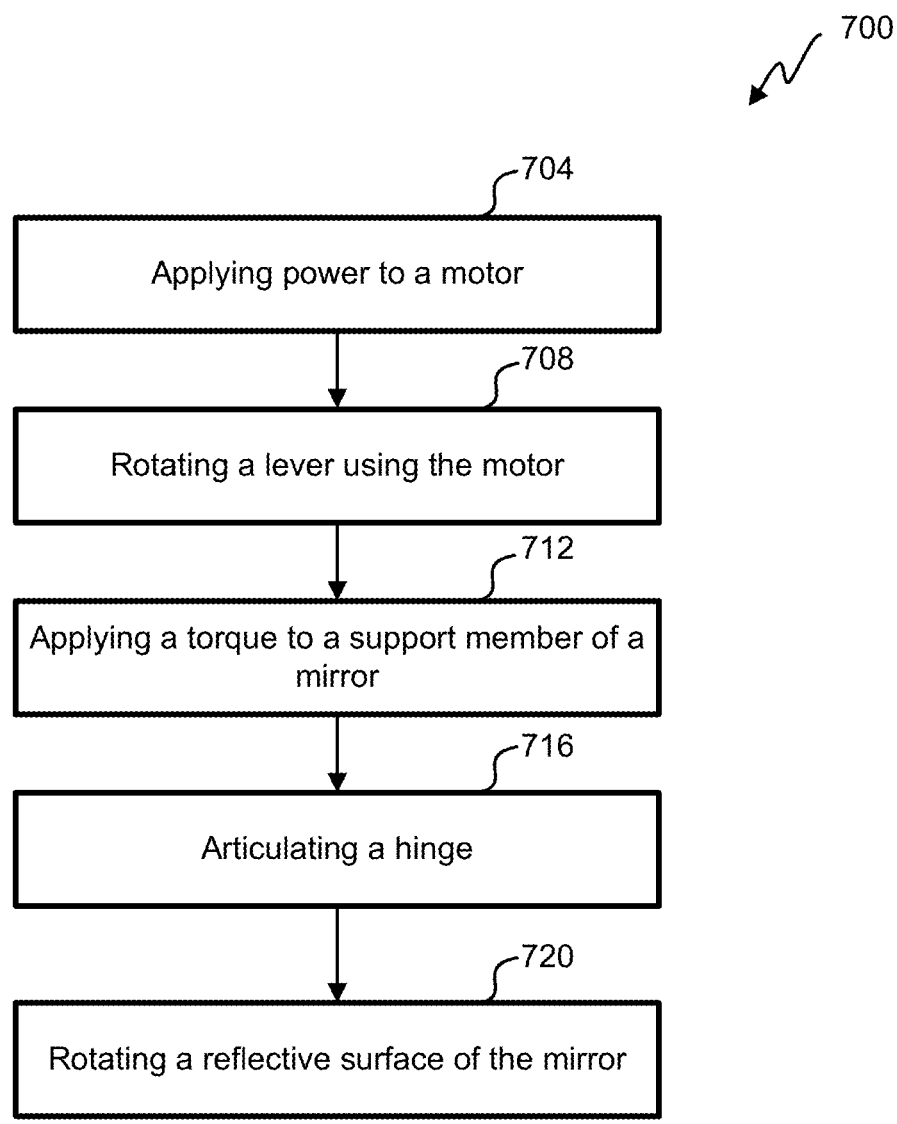
FIG. 7 illustrates a flowchart of an embodiment of a method of using a lever to provide torque for rotating a reflective surface.

FIG. 7 illustrates a flowchart of an embodiment of a method 700 of providing torque for bean steering in a light detection and ranging (LiDAR) system. Method 700 begins in step 704 with applying power to a combdrive actuator (e.g., the first combdrive actuator 404-1). The first combdrive actuator 404-1 is used to rotate a lever (e.g., the first lever 420-1), step 708, to apply a torque (a first torque) to a supporting beam (e.g., the first supporting beam 408-1) of a mirror (e.g., mirror 221), step 712. The first combdrive actuator 404-1 moves the first rotor 336-1, which moves the first lever 420-1, which applies a force (and torque) to the first supporting beam 408-1. The force causes the first supporting beam 408-1 to rotate.

As the force/torque is applied, the supporting beam rotates. As the supporting beam rotates, a hinge (e.g., the first hinge 424-1) is a joint made to flex to allow for articulated movement between the lever and the supporting beam, step 716. As the supporting beam rotates, a reflective surface (e.g., the reflective surface 312) of the mirror also rotates (e.g., about the second axis 226), step 720. A second, third, and/or fourth force/torque can be applied to one or more supporting beams using a second combdrive actuator and/or second hinge, a third combdrive actuator and/or third hinge, and/or a fourth combdrive actuator and/or a fourth hinge.

In some embodiments, the mirror is part of a mirror array, and the method further comprises moving the mirror in sync with other mirrors in the mirror array to steer an optical beam reflected by a plurality of mirrors in the mirror array.

Figure 8:
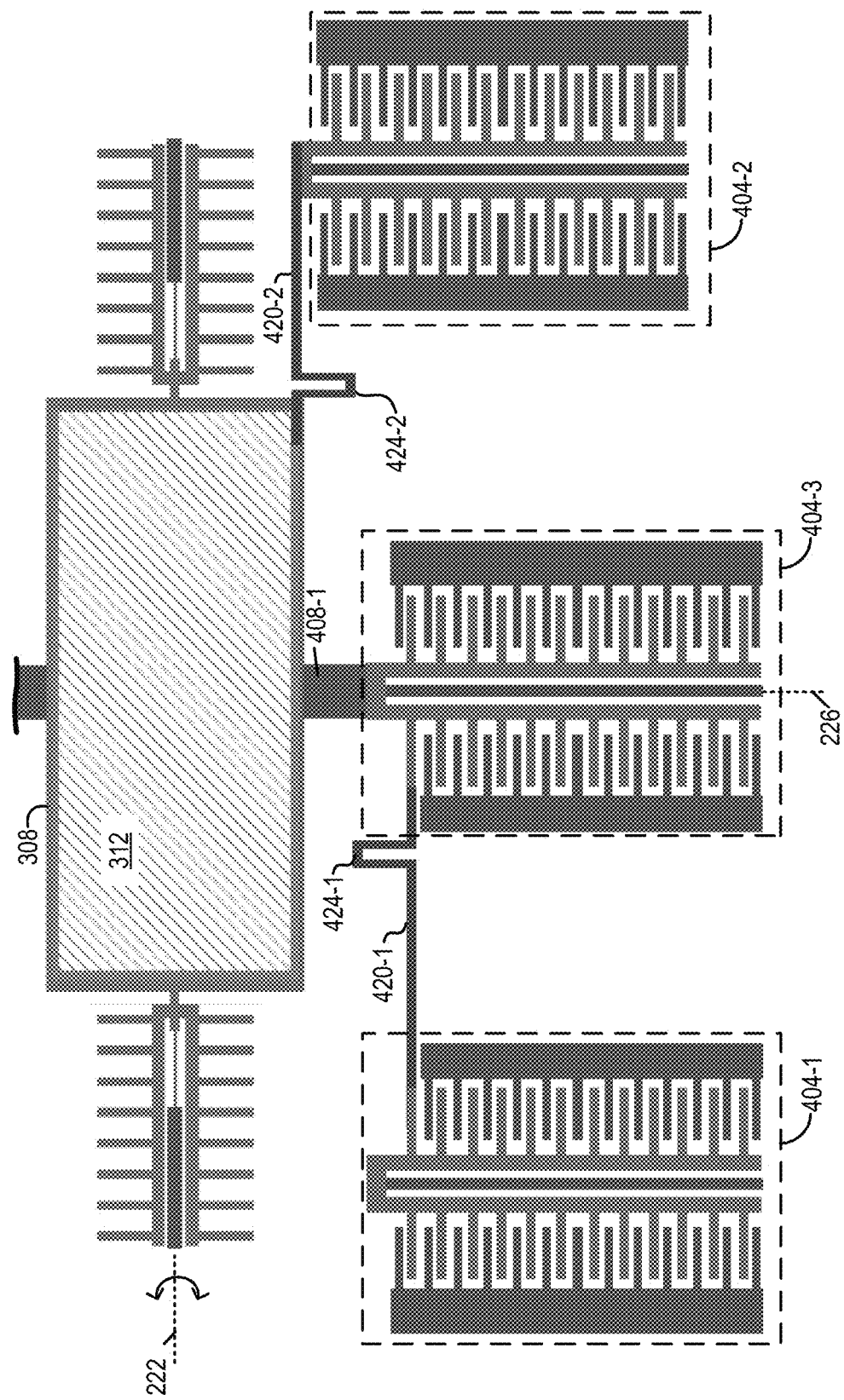
FIG. 8 illustrates another embodiment of using levers for rotating a reflective surface.

FIG. 8 illustrates another embodiment of using levers for rotating a reflective surface. FIG. 8 illustrates some variations that could be used for moving the reflective surface 312 (e.g., in combination with features from other embodiments). FIG. 8 depicts a first combdrive actuator 404-1, a second combdrive actuator 404-2, and a third combdrive actuator 404-3 on one side of the mirror 221. The third combdrive actuator 404-3 rotates about an axis that is coincident with the second axis 226. The first lever 420-1 and the first hinge 424-1 are mechanically coupled with the first supporting beam 408-1 through the third combdrive actuator 404-3 (i.e., the first lever 420-1 and the first hinge 424-1 are between the first combdrive actuator 404-1 and the third combdrive actuator 404-3; the third combdrive actuator 404-3 is mechanically between the first combdrive actuator 404-1 and the first supporting beam 408-1). The third combdrive actuator 404-3 rotates in the same direction as the mirror and 180 degrees out of phase with the first combdrive actuator 404-1. The second combdrive actuator 404-2 is coupled with the mirror 221 by the second hinge 424-2 being coupled to a side of the mirror 221, where the side of the mirror 221 is considered a supporting beam.

The ensuing description provides preferred exemplary embodiment(s) only, and is not intended to limit the scope, applicability, or configuration of the disclosure. Rather, the ensuing description of the preferred exemplary embodiment(s) will provide those skilled in the art with an enabling description for implementing a preferred exemplary embodiment. It is understood that various changes may be made in the function and arrangement of elements without departing from the spirit and scope as set forth in the appended claims.

The specific details of particular embodiments may be combined in any suitable manner without departing from the spirit and scope of embodiments of the invention. However, other embodiments of the invention may be directed to specific embodiments relating to each individual aspect, or specific combinations of these individual aspects.

Also, it is noted that the embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed, but could have additional steps not included in the figure. A process may correspond to a method, a function, a procedure, a subroutine, a subprogram, etc.

A recitation of "a", "an", or "the" is intended to mean "one or more" unless specifically indicated to the contrary.

All patents, patent applications, publications, and descriptions mentioned here are incorporated by reference in their entirety for all purposes. None is admitted to be prior art.

What is claimed is:

1. A device for beam steering in a Light Detection and Ranging (LiDAR) system of an autonomous vehicle, the device comprising:
    a mirror comprising:
        a reflective surface; and
        a supporting beam, wherein the supporting beam is configured to rotate the reflective surface by force being applied to the supporting beam;
    a combdrive actuator, wherein:
        the combdrive actuator is configured to apply a torque to the supporting beam; and
        the supporting beam is mechanically between the combdrive actuator and the reflective surface;
    a lever mechanically coupling the combdrive actuator with the supporting beam, wherein the lever is configured to apply a force to the supporting beam;
    a hinge coupling the lever with the supporting beam, wherein the hinge is configured to allow for articulated movement between the lever and the supporting beam; and
    an actuator with a spring configured to harmonically oscillate the mirror about a first axis, wherein the supporting beam is configured to rotate the reflective surface about a second axis, and wherein the first axis is not parallel to the second axis.

2. The device of claim 1, wherein the combdrive actuator applies a force to the mirror such that the mirror rotates in an opposite direction as a rotation of the combdrive actuator.

3. The device of claim 1, wherein the supporting beam is a post on one side of the mirror.

4. The device of claim 3, wherein:
    the combdrive actuator is a first combdrive actuator;
    the torque is a first torque;
    the device further comprises a second combdrive actuator on a same side of the mirror as the first combdrive actuator;
    the second combdrive actuator is mechanically coupled with the supporting beam; and
    the second combdrive actuator is configured to apply a second torque to the supporting beam.

5. The device of claim 4, wherein:
    the hinge is a first hinge;
    the lever is a first lever;
    the device further comprises:
        a second lever coupled with the second combdrive actuator; and
        a second hinge that mechanically couples the second lever with the supporting beam; and the second hinge is configured to provide for articulated movement between the second lever and the supporting beam.

6. The device of claim 1, wherein:

a rotor of the combdrive actuator rotates about a third axis;

the supporting beam is configured to rotate the reflective surface about a fourth axis;

the first axis is parallel with the second axis; and the hinge is closer to the second axis than the first axis.

7. The device of claim 1, wherein:

the combdrive actuator is a first combdrive actuator;

the supporting beam is a first supporting beam; and the device further comprises:

a second supporting beam on an opposite side of the mirror than the first supporting beam;

a second combdrive actuator on a same side of the mirror as the first combdrive actuator, wherein the second combdrive actuator is coupled with the first supporting beam;

a third combdrive actuator on the opposite side of the mirror, wherein the third combdrive actuator is coupled with the second supporting beam; and a fourth combdrive actuator on the opposite side of the mirror, wherein the fourth combdrive actuator is coupled with the second supporting beam.

8. The device of claim 7, wherein:

the actuator is a first actuator, and the device further comprises a second actuator configured to rotate the mirror about the first axis;

the first combdrive actuator, the second combdrive actuator, the third combdrive actuator, and the fourth combdrive actuator are configured to rotate the mirror about the second axis.

9. The device of claim 1, wherein the lever and the hinge are made from a silicon crystal layer of a semiconductor wafer.

10. The device of claim 1, wherein reflective surface is rectangular.

* * * * *